United States Patent [19]
Beintner et al.

[11] Patent Number: 6,013,937
[45] Date of Patent: Jan. 11, 2000

[54] BUFFER LAYER FOR IMPROVING CONTROL OF LAYER THICKNESS

[75] Inventors: Jochen Beintner; Ulrike Gruening, both of Wappingers Falls; Carl Radens, Poughkeepsie, all of N.Y.

[73] Assignees: Siemens Aktiengesellshaft, Munich, Germany; International Business Machines Corporation, Armonk, N.Y.

[21] Appl. No.: 08/938,196

[22] Filed: Sep. 26, 1997

[51] Int. Cl.[7] .......................... H01L 29/00; H01L 29/06; H01L 21/336; H01L 21/31; H01L 21/469
[52] U.S. Cl. .................. 257/513; 257/622; 438/296; 438/763; 438/970; 216/39
[58] Field of Search .................... 438/243, 296, 438/386, 691, 699, 702, 757, 763, 791, 970; 257/513, 622; 216/17, 39

[56] References Cited

U.S. PATENT DOCUMENTS

| | | | |
|---|---|---|---|
| 5,597,756 | 1/1997 | Fazan | 438/398 |
| 5,656,535 | 8/1997 | Ho | 438/386 |
| 5,763,932 | 6/1998 | Pan | 257/510 |

*Primary Examiner*—Chandra Chaudhari
*Assistant Examiner*—Nema Berezny
*Attorney, Agent, or Firm*—Stanton C. Braden

[57] ABSTRACT

A pad layer disposed on a semiconductor substrate 102 and a buffer layer 108 disposed within the pad layer such that the pad layer is divided into a dielectric layer 106 below the buffer layer and a mask layer 110 above the buffer layer. A method of forming layers with uniform planarity and thickness on a semiconductor chip includes the steps of providing a substrate having a thermal pad 106 formed thereon, forming a dielectric layer 106 on the thermal pad, forming a buffer layer 108 on the dielectric layer wherein the buffer layer is made from a different material than the dielectric layer and forming a mask layer 110 on the buffer layer wherein the buffer layer is made from a different material than the mask layer.

5 Claims, 10 Drawing Sheets

BUFFER LAYER FOR IMPROVING CONTROL OF LAYER THICKNESS

BACKGROUND

1. Technical Field

This disclosure relates to semiconductor devices and more particularly, to a buffer layer disposed within a dielectric layer to allow improved control of dielectric thickness and planarity and a method of forming the buffer layer.

2. Description of the Related Art

Semiconductor wafers, such as those made of silicon, are used as a substrate for processing integrated circuit chips. As processing has improved over the years wafer diameters have increased to their current size of approximately 8 inches and greater. Wafers are generally sliced off from a large silicon crystal ingot and are generally circular in shape.

Decreasing feature size for integrated circuit chips has increased the criticality of the planarity of the wafer. Today, with sub-micron features becoming widespread, surface planarity is assuming new importance, since it offers a key to boosting performance. Process control for these ever decreasing feature sizes increasingly becomes more dependent on surface uniformity and planarity. Surface uniformity and planarity is difficult to control especially when a surface layer has been exposed to many processing steps. The processing steps, for example dry etching, wet etching, or chemical mechanical polishing (CMP), may partially consume the surface layer reducing the planarity and adding non-uniformities on the surface.

Chemical mechanical polishing (CMP) is a process for improving the surface planarity of a semiconductor wafer and involves the use of mechanical pad polishing systems usually with a silica-based slurry. CMP offers a practical approach to achieving the important advantage of global wafer planarity. However, CMP systems for global planarization have certain limitations. These limitations include low wafer throughput, polished surface non-uniformity and a problem related to polishing uniformity known as "edge exclusion".

Surface non-uniformity often has a negative effect on photolithographic masking. Non-uniformities are carried through sequential processing resulting in variations in dielectric layers and performance of components. Photolithographic images are distorted having undesired effects on electronic components formed on the semiconductor chip.

As shown in FIG. 1, during manufacturing of trench capacitors in a semiconductor chip 10, a pad stack 11 is formed on the surface of the substrate. The pad stack comprises sequential pad layers. A first pad dielectric layer 14 is formed on the substrate 16. The first pad layer is typically a pad oxide layer formed by thermal oxidation. A second pad layer 12 is formed over the pad oxide layer, which typically comprises nitride.

The pad oxide layer promotes adhesion and reduces stress between the pad nitride layer and the substrate.

Above the pad nitride layer is hard mask layer 18. The hard mask layer is typically patterned to serve as a mask for etching of deep trenches used to form trench capacitors. The hard mask layer comprises, for example, TEOS or boronsilicate glass (BSG).

The pad nitride layer 12 serves as a polish and/or an etch stop layer. As such, the pad stop layer 12 is subjected to polishing steps and etching steps during processing. Pad layer 12 frequently has a non-uniform thickness due to this prior processing. In order for this layer to be effective as a polish or etch stop layer, it must maintain a certain minimum safe thickness if it is to act as a polish stop, for example. The non-uniformities created in earlier polishing and etching steps potentially leave "low spots" which can be below the minimum required thickness of the stop layer.

Therefore, a need exists for a method and apparatus for creating a uniform thickness layer which has been exposed to prior processing steps.

SUMMARY OF THE INVENTION

A semiconductor device for forming dielectric layers of uniform thickness includes a pad layer disposed on a semiconductor substrate. The pad layer comprises a dielectric material. A buffer layer is disposed within the pad layer such that the pad layer is divided into a dielectric layer below the buffer layer and a pad layer above the buffer layer.

In particular the semiconductor device includes a plurality of dielectric layers and a plurality of buffer layers therethrough. The buffer layer can be made from an oxide, preferably TEOS and the dielectric layer can be made from silicon nitride. The buffer layer can be less than about 100 angstroms thick, preferably between about 50 and 100 angstroms thick. The semiconductor device with the buffer layer can be used in fabricating trench capacitors.

A method of forming layers with uniform planarity and thickness on a semiconductor chip includes the steps of providing a substrate having a thermal pad formed thereon, forming a dielectric layer on the thermal pad, forming a buffer layer on the dielectric layer wherein the buffer layer is made from a different compound than the dielectric layer and forming a mask layer on the buffer layer wherein the buffer layer is made from a different compound than the mask layer.

In one embodiment, the buffer layer is an oxide, preferably TEOS, and the pad layer is silicon nitride. The step of using the buffer layer as an additional etch stop and forming a layer of glass on the pad layer can be included. The following step of forming a plurality of pad stop layers on a plurality of buffer layers wherein the plurality of buffer layers are made from a different compound than the plurality of pad stop layers or using the buffer layer as a polish stop may also be included.

A method of forming layers with uniform planarity and thickness in semiconductor chips with trenches may include the steps of providing a semiconductor device having a pad layer disposed on a semiconductor substrate, and a buffer layer disposed within the pad stop layer such that the pad stop layer is divided into a dielectric layer below the buffer layer and a pad stop layer above the buffer layer, forming trenches within the semiconductor chip, filling the trenches with a filler, polishing to the pad stop layer, using the buffer layer as an etch stop for removing the pad stop layer and removing the buffer layer such that a substantially uniform surface is formed on the dielectric layer. The step of forming a TEOS collar within the trenches is included. The step of removing the buffer layer may include removing the buffer layer and a portion of the TEOS layer simultaneously. The buffer layer may be formed from TEOS and the mask layer and the dielectric layer formed from silicon nitride. A layer of glass on the mask layer is formed prior to forming trenches. The steps of forming a plurality of pad stop layers on a plurality of buffer layers wherein the plurality of buffer layers are made from a different compound than the plurality of pad stop layers is included.

In alternate embodiments, the steps of refilling the trenches with a filler and using chemical downstream etching (CDE), dry etching, wet etching or CMP to form a recess in the forming a shallow trench isolator in the recess, for example, and using the dielectric layer as a polishing stop for polishing the shallow trench isolator trenches may be included.

BRIEF DESCRIPTION OF DRAWINGS

This disclosure will present in detail the following description of preferred embodiments with reference to the following figures wherein.

DETAILED DESCRIPTION OF THE INVENTION

The present disclosure describes a method of forming a buffer layer within a pad layer, separating it into a pad stop layer and a dielectric layer. The pad stop layer can be polished, etched and processed as needed. When pad stop layer is no longer necessary, it can be selectively etched away to expose the buffer layer. The buffer layer can now be processed and/or selectively etched away to expose the dielectric layer. Since the dielectric layer has been protected during previous processing, the dielectric layer has a pre-determined thickness above a minimum required thickness to serve as a polish or etch stop and may be advantageously used to create electronic components therefrom on a semiconductor chip.

Figure 1:
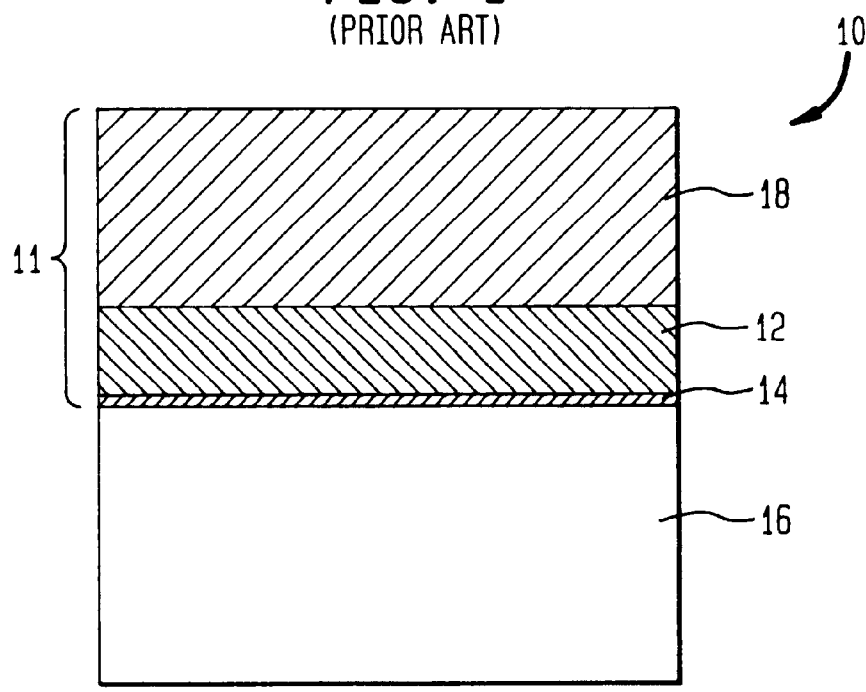
FIG. 1 is a cross sectional view of a prior art semiconductor chip.
Figure 2:
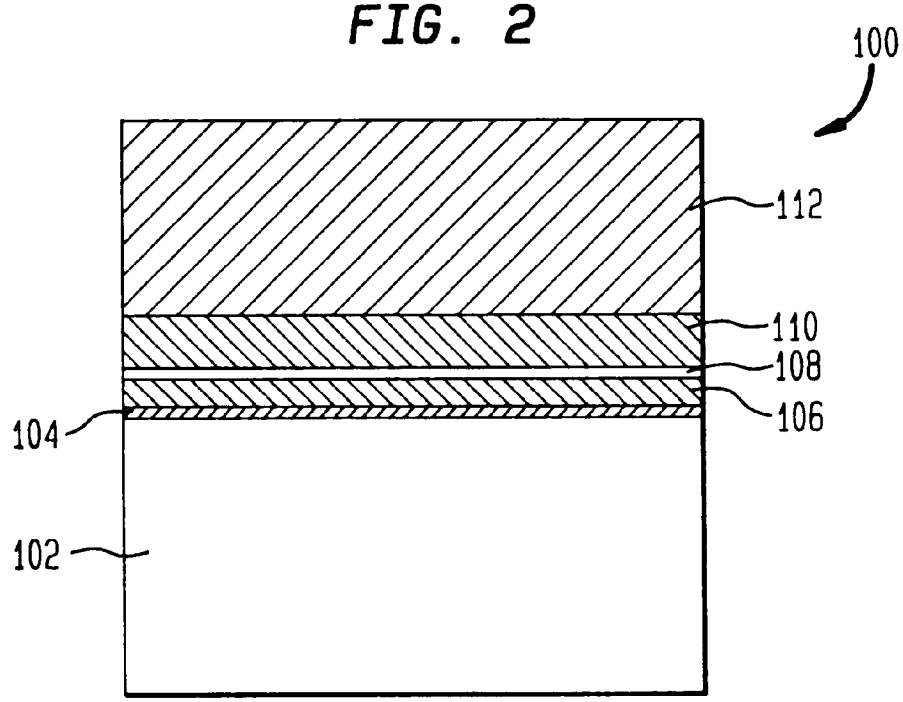
FIG. 2 is a cross sectional view of a semiconductor chip showing a buffer layer.

Referring now in specific detail to the drawings in which like reference numerals identify similar or identical elements throughout the several views, and initially to FIG. 2, a cross section of a substrate 102. The substrate represents a portion of an IC. Such an IC includes a memory circuit such as a random access memories (RAM), a dynamic RAM (DRAM), a synchronous DRAM (SDRAM), or a static RAM (SRAM). The IC can also be a logic device such as a programmable logic array (PLA), an application specific ICs (ASIC), a merged DRAM-logic circuit, or any circuit device.

Typically, numerous ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other electronic products.

As shown, a substrate 102 is provided. The substrate, for example, comprises a silicon wafer. Other semiconductor substrates such as gallium arsenide, germanium, silicon on insulator (SOI), or other semiconductor materials are also useful. The substrate, for example, may be lightly or heavily doped with dopants of a pre-determined conductivity to achieve the desired electrical characteristics.

A thermal pad layer 104 is formed on substrate 102. Thermal pad layer 104 may be formed by exposing substrate 102 to oxygen under elevated temperature conditions to form a silicon dioxide compound, for example. A dielectric layer 106 is formed on thermal pad layer 104. Dielectric layer 106 is formed using a chemical vapor deposition (CVD) process, for example low pressure chemical vapor deposition (LPCVD) or plasma enhanced chemical vapor deposition (PECVD).

A buffer layer 108 is formed on dielectric layer 106 by a gas deposition process. Buffer layer 108 is selectively removable with respect to a pad layer 110, dielectric layer 106 and materials in processed structures, for example trenches. Pad layer 110, buffer layer 108, and dielectric layer can, for example, have the following material combinations respectively: oxide/nitride/oxide, nitride/oxide/ nitride, oxide/polycrystalline silicon(poly)/oxide, nitride/poly/ nitride, poly/nitride/poly or poly/oxide/poly. Mask layer 110 is formed on buffer layer 108 by using a CVD process, for example LPCVD or PECVD. A hard move glass layer 112 is formed on mask layer 110. The hard mask layer comprises, for example, boron-silicate glass (BSG) or TEOS.

In one embodiment, dielectric layer 106 and mask layer 110 are generally made of silicon nitride. In order to differentiate the buffer layer 108 from layers 106 and 110, buffer layer 108 can be made from silicon dioxide, tetra-ethyloxosilane (TEOS) or polycrystalline silicon (poly). Preferably the buffer layer 108 comprises TEOS. Buffer layer 108 can be formed using a low pressure TEOS deposition process. After formation of buffer layer 108, buffer layer can be subjected to a wet oxide annealing process which maintains a temperature of between about 850 to 950 degrees C. for approximately 10 minutes in order to densify buffer layer 108. Densification of buffer layer 108 improves buffer layer's 108 resistance to chemical etching, for example, HF wet etching. Buffer layer 108 is, for example, less than about 100 Å and preferably in the range between 50 to 100 Å thick. Since conventional pad layer, is nominally about 2200 Å thick, the dielectric layer 106, buffer layer 108 and pad layer 110 of the invention should nominally add to a thickness of about 2200 Å thick. Dielectric layer 106 is preferably at least about 800 Å thick in order to achieve the appropriate amount of protection.

Figure 3:
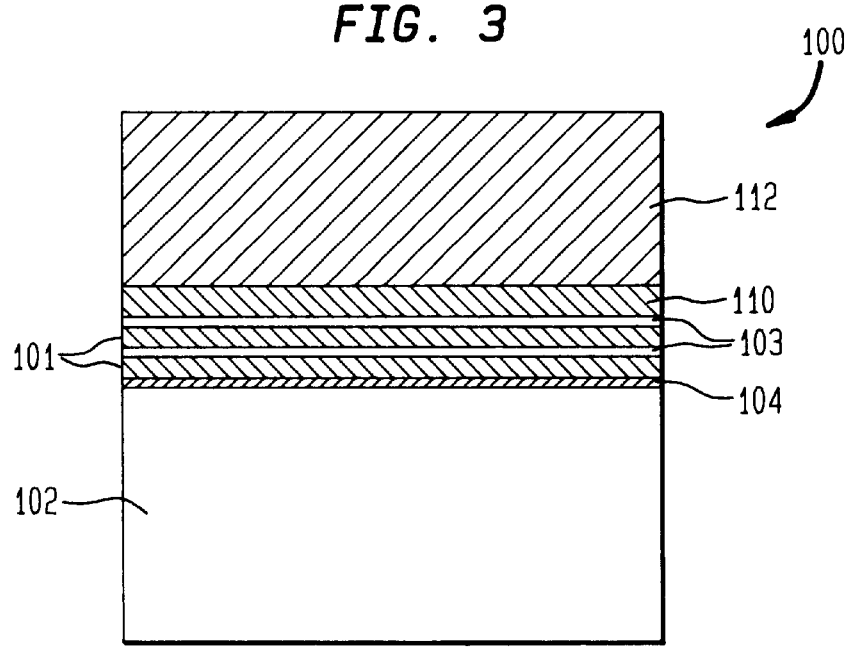
FIG. 3 is a cross sectional view of a semiconductor chip showing a plurality of buffer layers.

Referring to FIG. 3, it is contemplated that a plurality of dielectric layers 101 may be used with a plurality of buffer layers 103 to improve uniformity of layers during intermediate processing. Plurality of buffer layers 103 are sandwiched between dielectric layers 101 and can be used as polish or etch stops.

Figure 4:
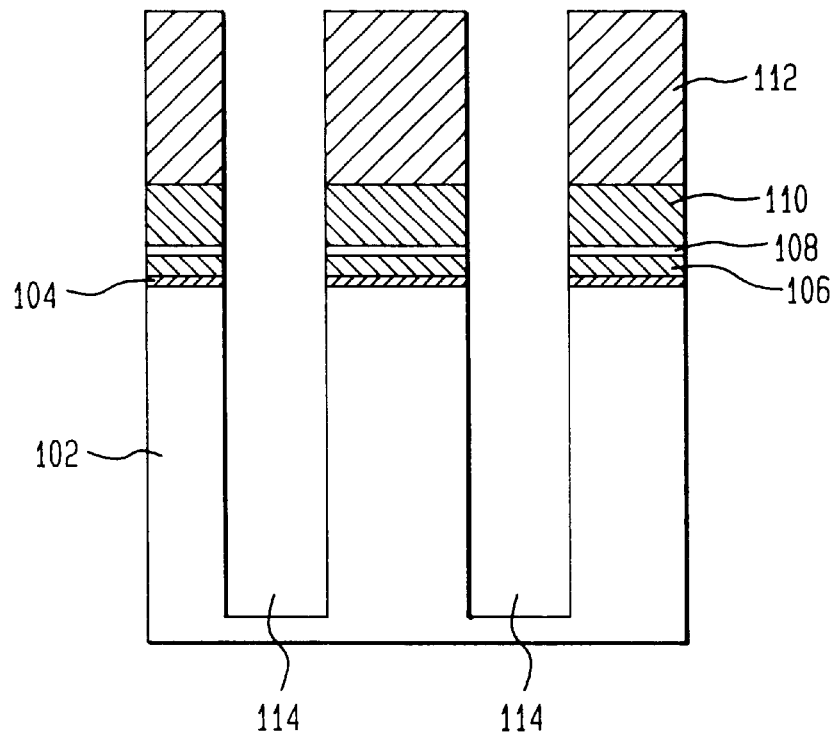
FIG. 4 is a cross sectional view of a semiconductor chip showing trenches formed therein.

Referring to FIGS. 4–12, one illustrative embodiment of the invention is shown. Referring to FIG. 4. a pad stack comprising a single buffer layer 108 that separates a dielectric layer 106 and a pad stop layer 110 is provided on the surface of the substrate. As shown, trenches 114 are formed in the substrate. Typically, the trenches are formed by patterning a hard etch mask layer 112 using conventional lithographic and etch techniques. The hard mask layer serves as a hard etch mask for a reactive ion etch (RIE) that is used to form the trenches. The hard mask layer is etched away by a wet etching process using, for example, HF as an etchant. At this point, a buried plate at the lower portion of the trenches is optionally formed using conventional techniques, such as providing a dopant source and outdiffusing the dopants therein into the substrate. The dopant source, for example, comprises arsenic doped silicate glass (ASG).

Figure 5:
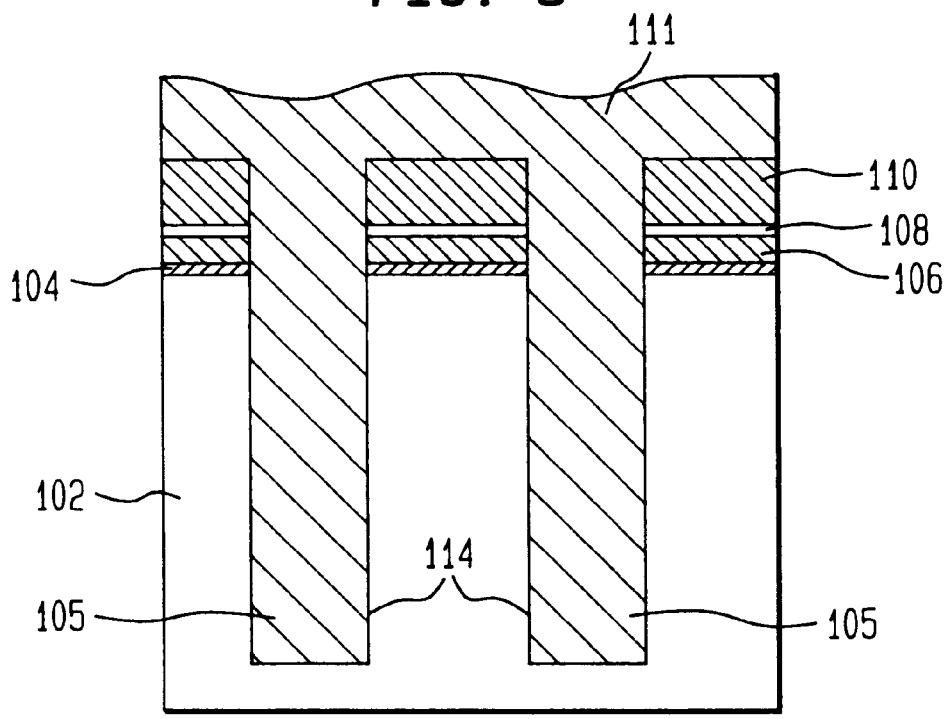
FIG. 5 is a cross sectional view of the semiconductor chip of FIG. 4 having trenches filled with a filler.
Figure 6:
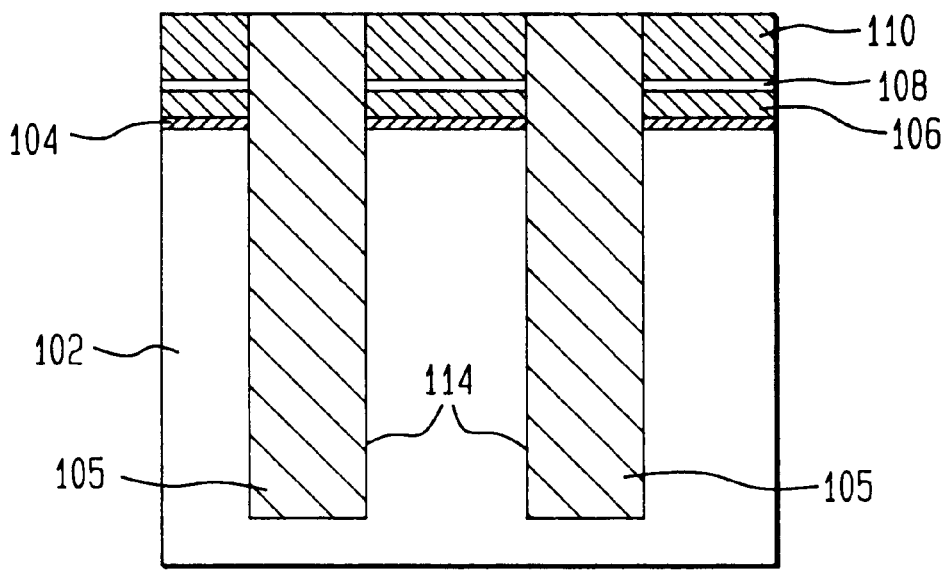
FIG. 6 is a cross sectional view of the semiconductor chip of FIG. 5 having a mask layer exposed by removing a filler layer thereon.
Figure 7:
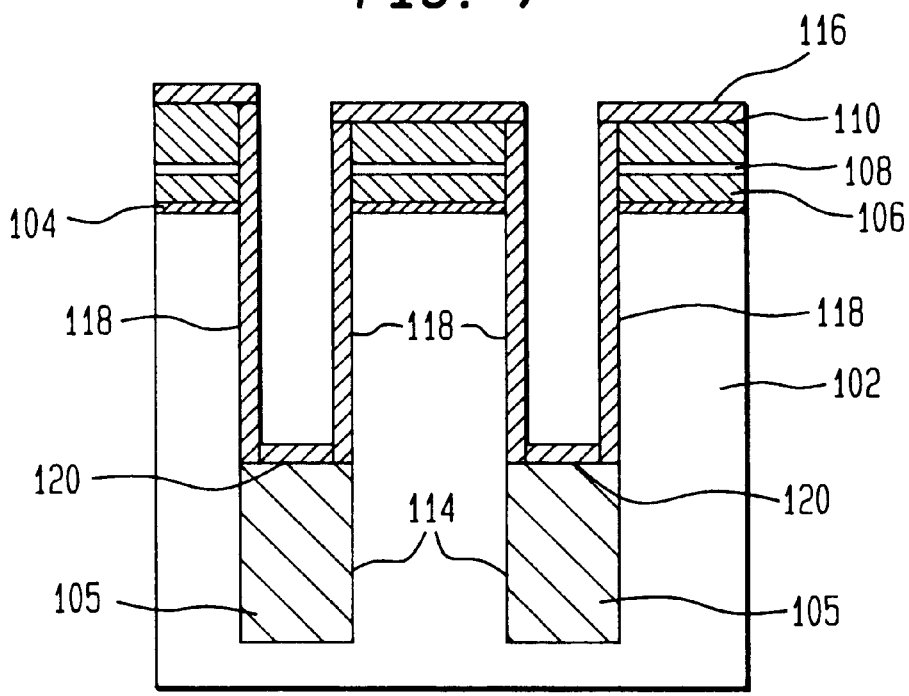
FIG. 7 is a cross sectional view of the semiconductor chip of FIG. 6 with the filler etched and a TEOS layer deposited.

Referring to FIG. 5, trenches 114 are filled with a filler 105, such as polycrystalline silicon (poly). The poly, for example, is heavily doped with, n-type dopants to form the node of the capacitors. The surface of poly 111 is polished by CMP to form a co-planar surface with the pad stop layer 110, as shown in FIG. 6. Referring to FIG. 7, filler 105 is recessed, leaving a portion of the filler material in the lower portion of the trenches. A TEOS layer 116 is deposited to line walls 118 and a bottom 120 of each trench 114. The TEOS is used to form a dielelctric collar to reduce parasitic leakage. Typically, the TEOS is annealed to improve the isolation characteristics of the layer.

Figure 8:
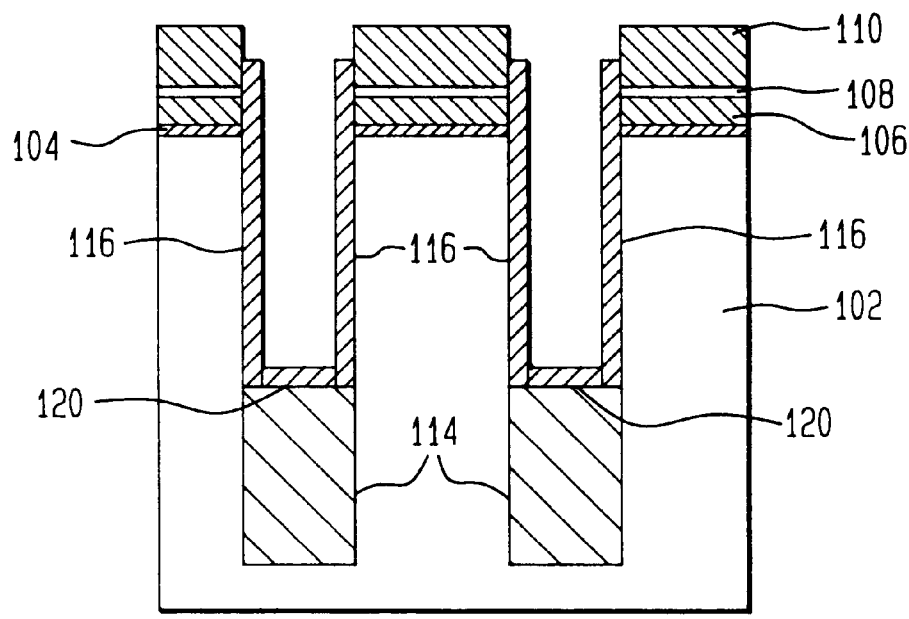
FIG. 8 is a cross sectional view of the semiconductor chip of FIG. 7 with a portion of the TEOS layer removed.
Figure 9:
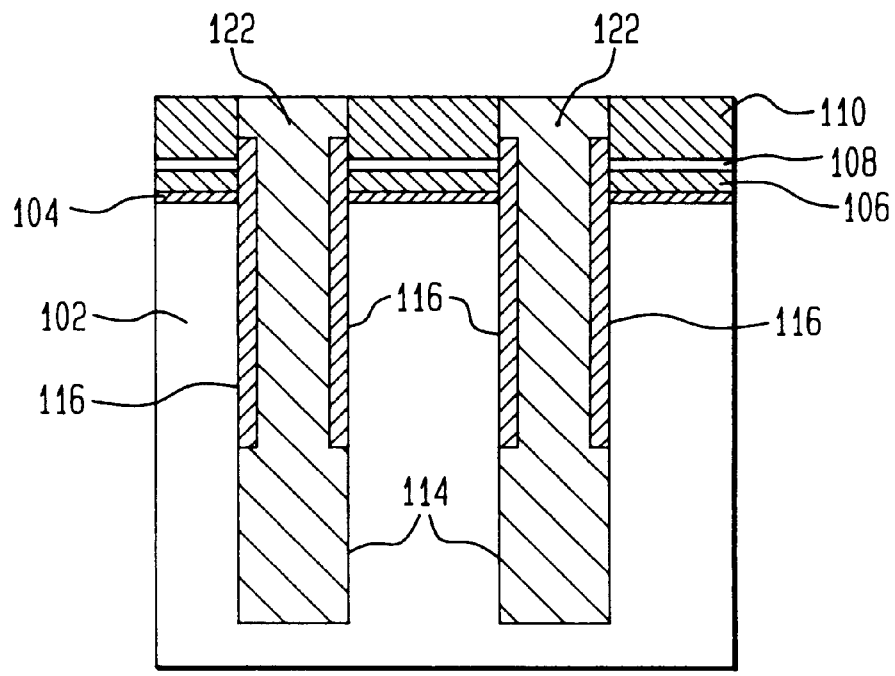
FIG. 9 is a cross sectional view of the semiconductor chip of FIG. 8 trenches filled with a filler and polished to the mask layer.
Figure 10:
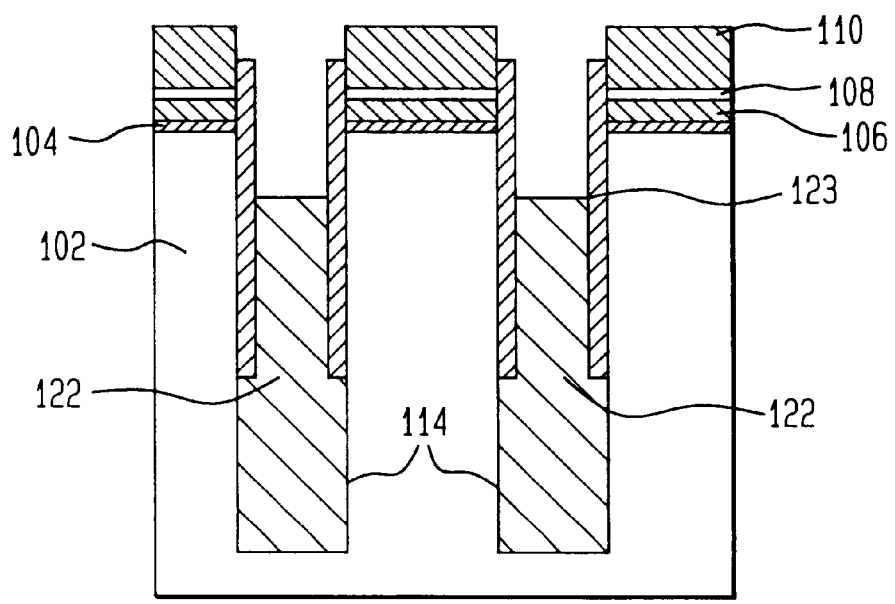
FIG. 10 is a cross sectional view of the semiconductor chip of FIG. 9 having the filler recessed.

Referring to FIG. 8. the TEOS layer 116 is removed from bottom 120 and mask layer 110 by reactive ion etching. The RIE also removes the TEOS layer from the surface of layer 110 as well as the upper portion of the trench sidewall. In FIG. 9, trenches 114 are then filled with a filler 122, such as n-doped poly. Filler 122, in FIG. 10, is removed by a wet etching process using, for example, HF as an etchant to a predetermined height 123 within trench 114. The predetermined height corresponds to, for example, the bottom of where a buried strap is to be formed, which also corresponds to where the top of the TEOS collar will be. Since the wet etch is selective to oxide (that is the TEOS does not get etched), the TEOS advantageously protects the silicon sidewalls from being etched.

Figure 11:
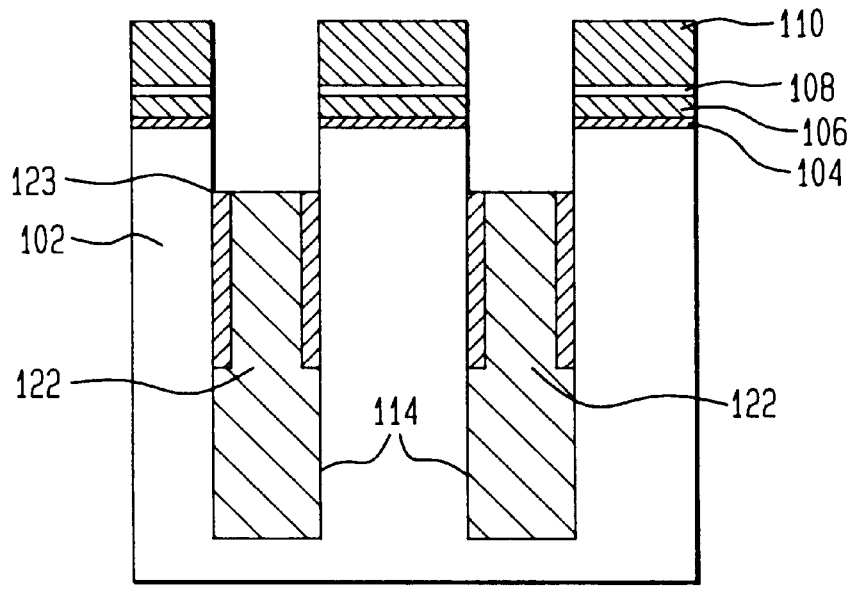
FIG. 11 is a cross sectional view of the semiconductor chip of FIG. 10 having TEOS layer etched to the filler.
Figure 12:
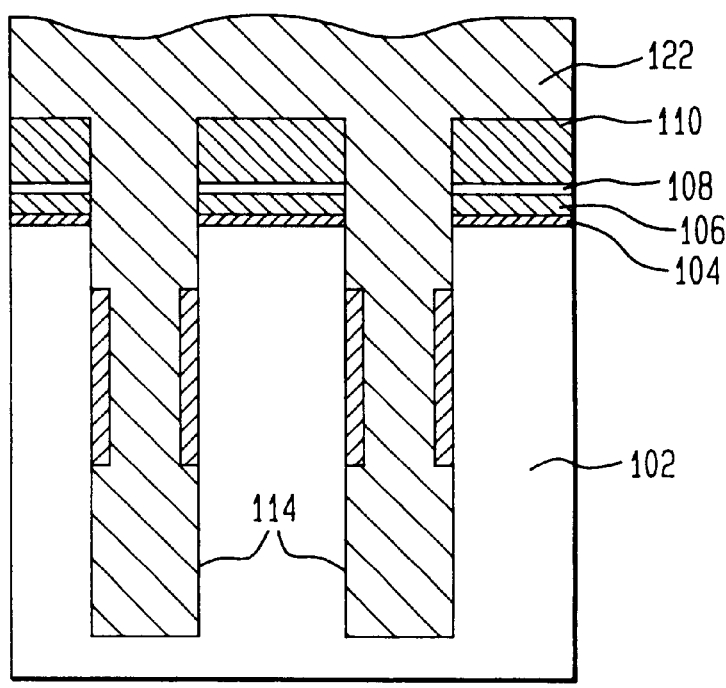
FIG. 12 is a cross sectional view of the semiconductor chip of FIG. 11 having trenches refilled.

Referring to FIG. 11, a wet etch selective to silicon is performed to remove the TEOS. This etch removes the TEOS up to about the top of the poly, forming the TEOS collar. In FIG. 12, a filler is then used to fill trenches 114. The filler, for example, is undoped poly used to form a buried strap.

Figure 13:
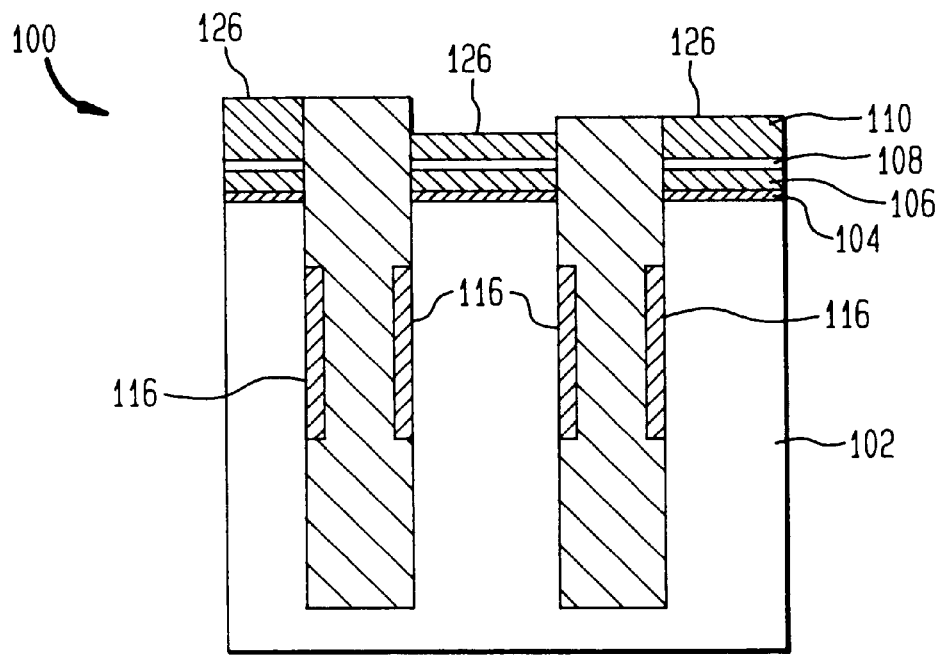
FIG. 13 is a cross sectional view of a semiconductor chip of an illustrative embodiment after polishing.
Figure 14:
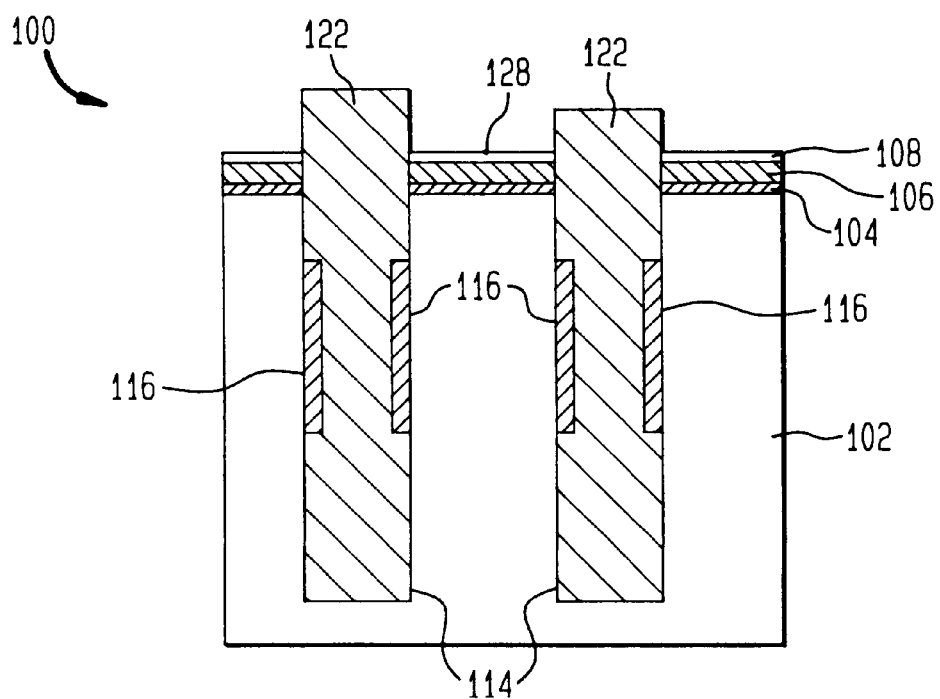
FIG. 14 is a cross sectional view of the semiconductor chip of FIG. 13 after removing the mask layer.

Referring to FIG. 13, after trenches 114 have been formed and filled, a chemical mechanical polishing (CMP) step is performed to remove layers of material above pad stop layer 110. As a result of polishing, a top surface 126 is uneven which is typical to some degree for all polishing procedures. Pad stop layer 110 is removed by a wet etch or dry etch, as shown in FIG. 14. In one embodiment, pad stop layer 110 is selectively etched to buffer layer 108. Buffer layer 108 can be an oxide while pad layer 110 is a nitride. By providing buffer layer 108 to serve as an etch stop, a more uniform surface 128 is achieved.

Figure 15:
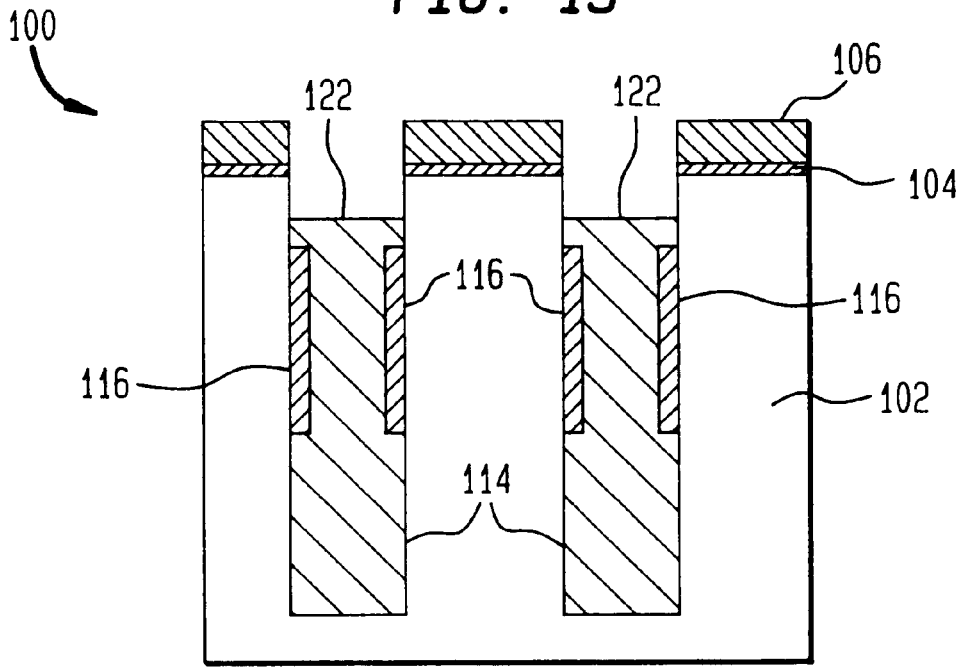
FIG. 15 is a cross sectional view of the semiconductor chip of FIG. 14 after a buffer layer is removed and showing a dielectric layer of substantially uniform thickness and planarity.

Referring to FIG. 15, buffer layer 108 is removed by etching, exposing dielectric layer 106. In one embodiment, dielectric layer 106 is a nitride while buffer layer 108 is an oxide, thereby allowing buffer layer to be selectively etched away. Dielectric layer 106 can now act as a etch stop during wet etching to recess filler 122 into substrate 102. The recess forms a buried strap of the trench capacitors. Dielectric layer 106 has at least a minimum thickness for use as a polish or etch stop between two layers. Processing can now be continued to form trench capacitors, for example. Dielectric layer 106 has a more uniform height across semiconductor chip 100.

Figure 16:
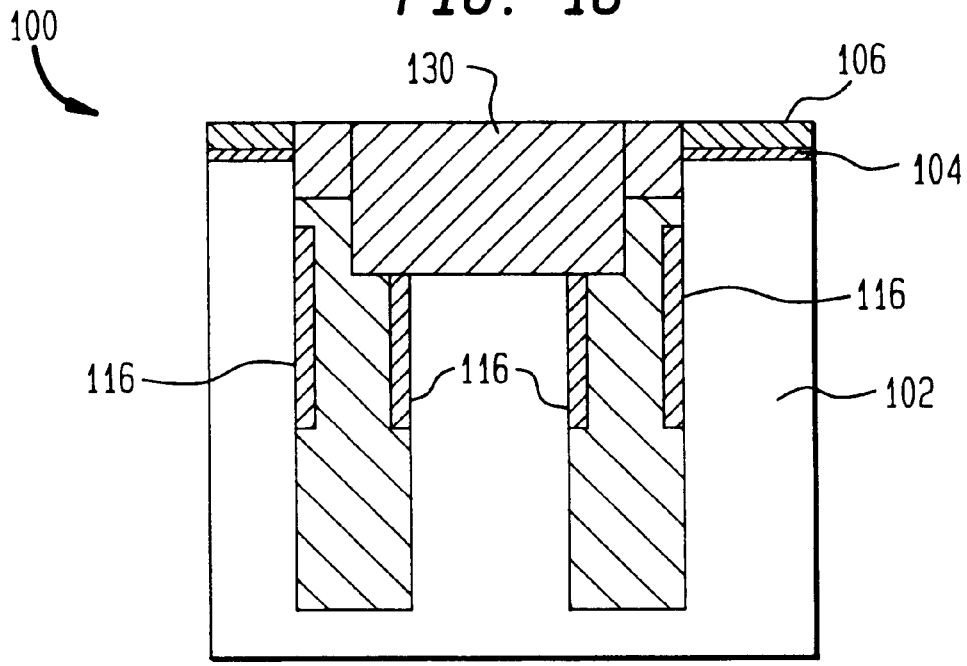
FIG. 16 is a cross sectional view of a semiconductor chip having a recess formed therein for receiving a shallow trench isolator therein and showing a dielectric layer acting as a polish stop.

Referring to FIG. 16, a shallow trench 130 is defined by conventional lithographic and etch techniques. The shallow trench is then filled with, for example, TEOS to form a shallow trench isolation (STI). The TEOS is annealed to densify it. The surface is polished, using dielectric layer 106 as a polish stop. This allows for better control of the STI 130 height and results in better performance.

Figure 17:
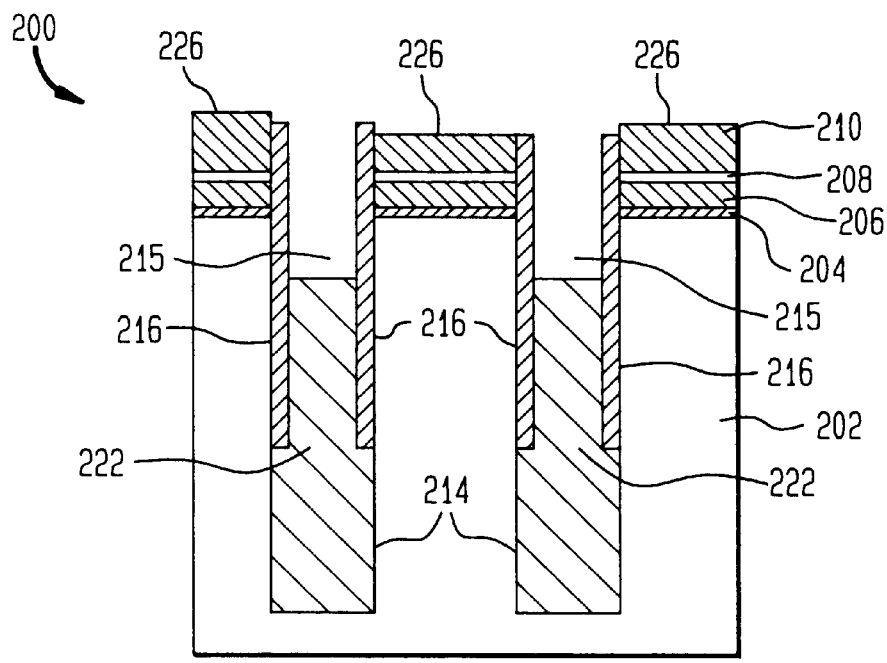
FIG. 17 is a cross sectional view of a semiconductor chip of another illustrative embodiment after polishing.

Referring to FIG. 17, another illustrative embodiment shows a TEOS layer 216 already formed within trenches 214 and a filler 222 introduced and etched to a predetermined height within trenches 214 forming a recess 215. Recess 215 may be formed using chemical downstream etching (CDE). A substrate 202 has a thermal pad layer 204 formed thereon. Thermal pad layer 204, a dielectric layer 206, a buffer layer 208 and a pad layer 210 are substantially as described above. A CMP process has already been performed creating a top surface 226 on mask layer 210 with height variations due to polishing.

Figure 18:
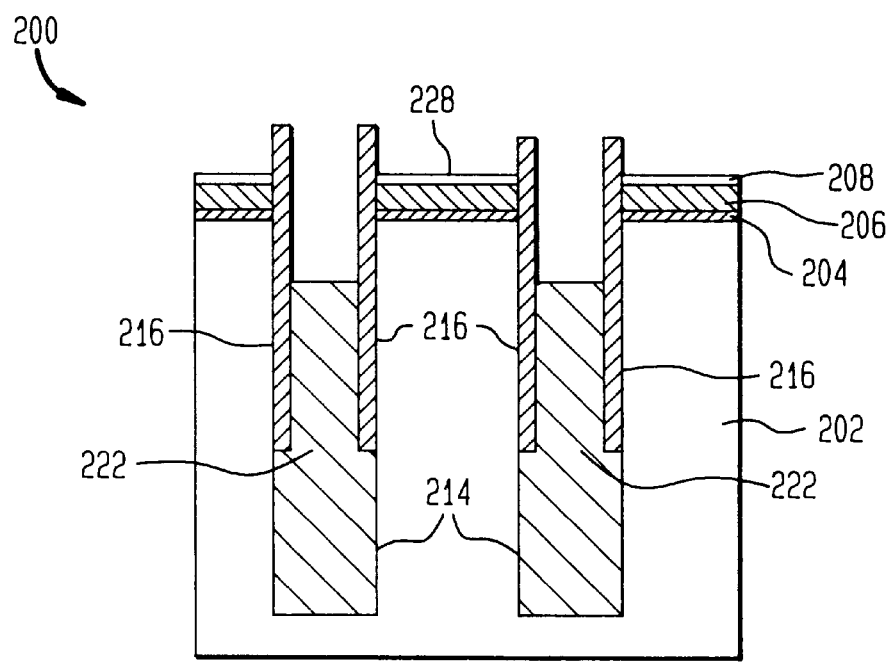
FIG. 18 is a cross sectional view of the semiconductor chip of FIG. 17 after removing the mask layer.

Referring to FIG. 18, pad layer 210 is removed by a selective wet etch or dry etch. Buffer layer 208 acts as an etch stop. In one embodiment, pad layer 210 is selectively etched to buffer layer 208. Buffer layer 208 can be an oxide while mask layer 210 is a nitride. By providing buffer layer 208, a more uniform surface 228 is achieved. If buffer layer 208 is an oxide, both buffer layer 208 and TEOS layer 216 can be removed in a single etching step. Filler 222 acts as a mask to prevent TEOS layer 216 from being removed where filler 222 is present in trenches 214.

Figure 19:
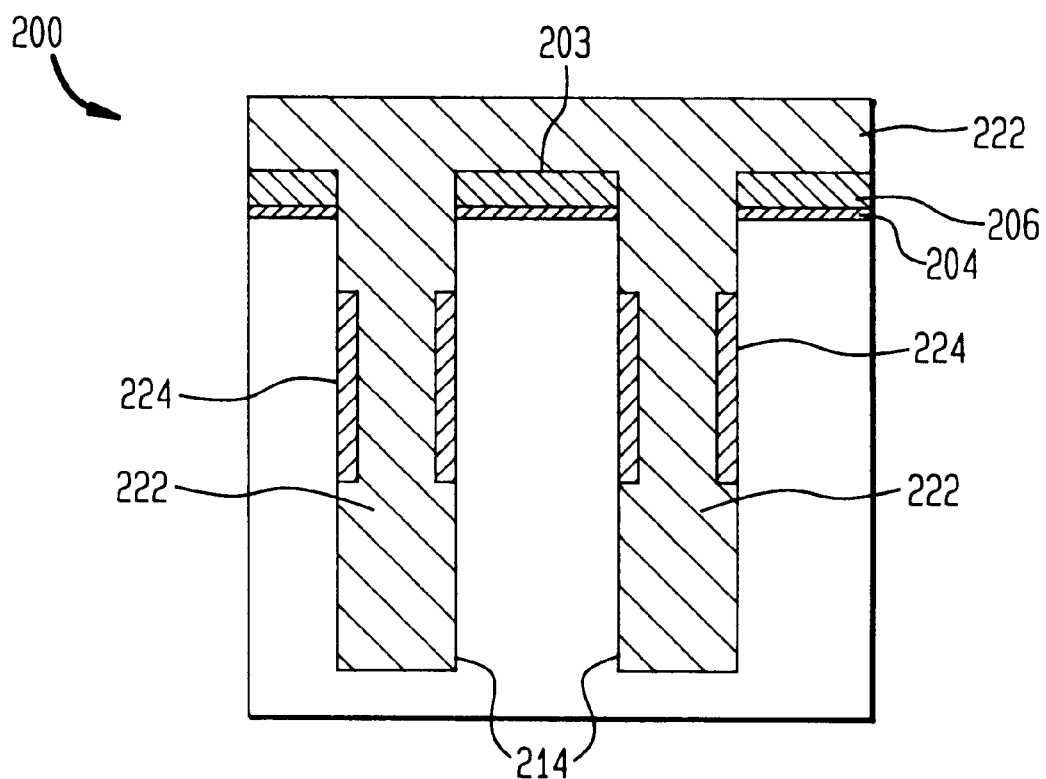
FIG. 19 is a cross sectional view of the semiconductor chip of FIG. 18 after a buffer layer is removed and showing a dielectric layer of substantially uniform thickness and planarity.

Referring to FIG. 19, dielectric layer 206 has a more uniform surface 203 thereon. A collar 224 has been formed in each trench 214, and filler 222 has been added for further processing to form trench capacitors. Filler 222 may be removed using chemical downstream etching (CDE) which can provide improved uniformity for etched surfaces. CMP may also be used, although CMP, as mentioned above, potentially creates more non-uniformities. By using CDE, a deep trench recess can be formed for the placement of an STI as shown in FIG. 16. STI will again use dielectric layer 206 as a polish stop as mentioned above. The polish stop is better defined due to reduced variations supplied by removal of buffer layer 208.

Having described illustrative embodiments of a buffer layer disposed within a dielectric layer to allow improved control of dielectric thickness and planarity and a method of forming the buffer layer (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor chip fabricated by the method of:

providing a semiconductor chip having a pad layer disposed on a semiconductor substrate;

forming a dielectric layer on the pad layer;

forming a buffer layer on the dielectric layer, the buffer layer being made from different material than the dielectric layer;

forming a mask layer on the buffer layer, the mask layer being made from different material than the buffer layer;

forming at least one trench in the semiconductor chip, each trench being formed in a portion of a top surface of the semiconductor chip through the mask, buffer, and dielectric layers, and through a portion of the substrate;

depositing a filler in the at least one trench and on the top surface;

polishing the filler from the top surface to expose a portion of the mask layer;

forming at least one dielectric collar in the at least one trench;

etching the exposed portion of the mask layer after formation of said dielectric collar, to expose a portion of the buffer layer; and removing the exposed portion of the buffer layer after etching said mask layer, to expose a portion of the dielectric layer.

2. A semiconductor device fabricated as in claim 1, wherein the pad layer includes a plurality of buffer layers therethrough.

3. A semiconductor device fabricated as in claim 1, wherein the buffer layer is made from TEOS and the mask layer and the dielectric layer are made from silicon nitride.

4. A semiconductor device fabricated as in claim 1, wherein the buffer layer is less than 100 angstroms thick.

5. A semiconductor device fabricated as in claim 1, wherein the buffer layer is between 50 and 100 angstroms thick.

* * * * *